(12) United States Patent
Cheah et al.

(10) Patent No.: US 10,734,318 B2
(45) Date of Patent: Aug. 4, 2020

(54) FOLDED SEMICONDUCTOR PACKAGE ARCHITECTURES AND METHODS OF ASSEMBLING SAME

(71) Applicant: Intel Corporation, Santa Clara, CA (US)

(72) Inventors: Bok Eng Cheah, Bukit Gambir (MY); Jackson Chung Peng Kong, Tanjung Tokong (MY); Khang Choong Yong, Puchong (MY); Yun Rou Lim, Bayan Lepas (MY)

(73) Assignee: Intel Corporation, Santa Clara, CA (US)

(*) Notice: Subject to any disclaimer, the term of this patent is extended or adjusted under 35 U.S.C. 154(b) by 0 days.

(21) Appl. No.: 16/018,635

(22) Filed: Jun. 26, 2018

(65) Prior Publication Data

US 2019/0148269 A1 May 16, 2019

(30) Foreign Application Priority Data

Nov. 14, 2017 (MY) .......................... PI 2017704333

(51) Int. Cl.
| | | |
|---|---|---|
| *H01L 23/49* | (2006.01) | |
| *H01L 23/498* | (2006.01) | |
| *H01L 23/00* | (2006.01) | |
| *H01L 21/768* | (2006.01) | |
| *H01L 23/538* | (2006.01) | |

(52) U.S. Cl.
CPC .... *H01L 23/4985* (2013.01); *H01L 21/76816* (2013.01); *H01L 23/5387* (2013.01); *H01L 24/09* (2013.01); *H01L 24/17* (2013.01); *H01L 24/16* (2013.01); *H01L 24/81* (2013.01); *H01L 2224/16225* (2013.01); *H01L 2224/16235* (2013.01); *H01L 2224/16237* (2013.01); *H01L 2224/81001* (2013.01); *H01L 2924/00014* (2013.01); *H01L 2924/1434* (2013.01); *H01L 2924/1436* (2013.01); *H01L 2924/15159* (2013.01); *H01L 2924/15311* (2013.01); *H01L 2924/181* (2013.01)

(58) Field of Classification Search
CPC ..... H01L 21/76816; H01L 2224/16225; H01L 23/4985; H01L 24/09; H01L 24/17; H01L 2924/15311

See application file for complete search history.

(56) References Cited

U.S. PATENT DOCUMENTS

| | | | | |
|---|---|---|---|---|
| 6,879,047 B1* | 4/2005 | Heo | ..................... | H01L 23/3128 257/685 |
| 2002/0050641 A1* | 5/2002 | Freeman | ............. | H01L 23/4985 257/737 |
| 2005/0184370 A1* | 8/2005 | Chiu | .................... | H01L 23/5387 257/678 |
| 2009/0090541 A1* | 4/2009 | Chia | .................... | H01L 23/5387 174/254 |

(Continued)

*Primary Examiner* — Mohammed Shamsuzzaman
(74) *Attorney, Agent, or Firm* — Schwegman Lundberg & Woessner, P.A.

(57) ABSTRACT

A fold in a semiconductor package substrate includes an embedded device that includes orthogonal electrical coupling through the package substrate by a bond-pad via that is configured to couple to a semiconductive device that is mounted on the semiconductor package substrate. The semiconductive device is coupled to the embedded device with the orthogonal electrical coupling.

12 Claims, 7 Drawing Sheets

(56) References Cited

U.S. PATENT DOCUMENTS

| | | | |
|---|---|---|---|
| 2010/0301474 A1* | 12/2010 | Yang | H01L 21/6835 |
| | | | 257/737 |
| 2012/0170231 A1* | 7/2012 | Lee | H05K 1/145 |
| | | | 361/749 |
| 2016/0050768 A1* | 2/2016 | Chen | H05K 7/06 |
| | | | 361/728 |
| 2017/0345763 A1* | 11/2017 | Cheah | H01L 24/18 |

* cited by examiner

FOLDED SEMICONDUCTOR PACKAGE ARCHITECTURES AND METHODS OF ASSEMBLING SAME

PRIORITY APPLICATION

This application claims the benefit of priority to Malaysian Application Serial Number PI 2017704333, filed Nov. 14, 2017, which is incorporated herein by reference in its entirety.

FIELD

This disclosure relates to semiconductor package substrates to achieve smaller form-factor packaging.

BACKGROUND

Semiconductive device miniaturization during packaging includes challenges to simplify semiconductor package interconnects while increasing packaging complexity in smaller form factors.

BRIEF DESCRIPTION OF THE DRAWINGS

Disclosed embodiments are illustrated by way of example, and not by way of limitation, in the figures of the accompanying drawings where like reference numerals may refer to similar elements, in which.

DETAILED DESCRIPTION

Device integration is facilitated by a folded semiconductor package architecture. Signal integrity is a feature of the folded semiconductor package architecture as selected signal paths pass orthogonally through the package substrate between active devices. A "virtual recess" is created by the folded semiconductor package, as the virtual recess is located between package ends of the folded semiconductor package substrate.

At least one embedded active device is assembled within the semiconductor package substrate before folding, to create an orthogonal signal path between the at least one embedded active device and a surface-mounted active device such as a central processing unit (CPU).

Figure 1A:
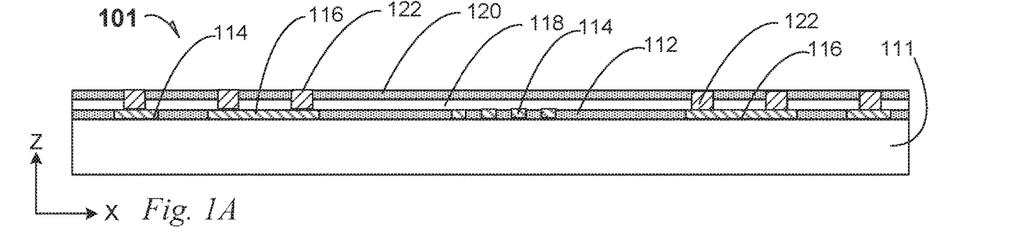
FIG. 1A is cross-section elevation of a semiconductor package during processing according to an embodiment.

FIG. 1A is cross-section elevation of a semiconductor package 101 during processing according to an embodiment. A carrier 111 such as a semiconductive material including an entire silicon wafer 111 may be used for a wafer-level processing of several semiconductor packages.

In an embodiment, an interlayer dielectric (ILD) first layer 112 is formed on the carrier 111, and the ILD first layer 112 has been patterned and a selection of several bond pads 114 and traces 116 (a few occurrences each of which are enumerated). A subsequent ILD layer 118 has been applied to the first ILD layer 112, as well as a third ILD layer 120 has been applied to the subsequent ILD layer 118. In an embodiment, processing has resulted in the third ILD layer 120 being patterned and a selection of electrical pillars 122 have been formed to contact some of the bond pads 114 as well as some of the traces 116. In an embodiment, the electrical pillars 122 are copper that is formed from electroplating onto the bond pads 114 and the traces 116. In an embodiment, the electrical pillars 122 are copper that is formed from electroless plating onto the bond pads 114 and the traces 116. In an embodiment, the material of the first, second and third ILD layers 112, 118 and 120 includes poly siloxanes. In an embodiment, the material of the first, second and third ILD layers 112, 118 and 120 includes epoxy resins. In an embodiment, the material of the first, second and third ILD layers 112, 118 and 120 includes acrylates (e.g., poly methyl methacrylate, both ultraviolet curable and O2/H2O initiated). In an embodiment, the material of the first, second and third ILD layers 112, 118 and 120 includes polyurethanes. In an embodiment, the material of the first, second and third ILD layers 112, 118 and 120 includes benzocyclobutene (BCB). In an embodiment, the material of the first, second and third ILD layers 112, 118 and 120 includes polyitnides. In an embodiment, the material of the first, second and third ILD layers 112, 118 and 120 includes high-density polyethylene (HDPE), bismaleimide-triazine (BT) resins. In an embodiment, the material of the first, second and third ILD layers 112, 118 and 120 includes liquid crystal polymers (LCPs). In an embodiment, the material of the first, second and third ILD layers 112, 118 and 120 includes aramids. In an embodiment, the material of the first, second and third ILD layers 112, 118 and 120 includes polydimethylsiloxanes (PDMSs). In an embodiment, the material of the first, second and third ILD layers 112, 118 and 120 includes polyesters. In an embodiment, the material of the first, second and third ILD layers 112, 118 and 120 includes fiber-glass epoxies. In an embodiment, the first, second and third ILD layers 112, 118 and 120 are formed employing other materials that are useful for a given application. In an embodiment, the first, second and third ILD layers 112, 118 and 120 are formed using materials different from one another.

In an embodiment, the thickness (Z-direction) of the respective first, second and third ILD layers 112, 118 and 120 range from 10 micron (μm) to 30 μm.

Figure 1B:
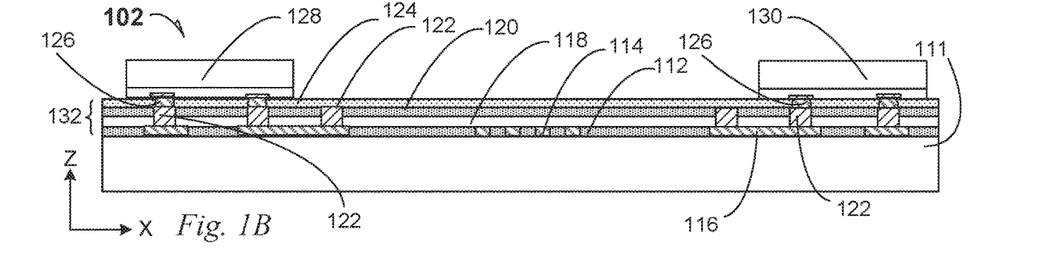
FIG. 1B is a cross-section elevation of the semiconductor package depicted in FIG. 1A after further processing according to an embodiment.

FIG. 1B is a cross-section elevation of the semiconductor package 101 depicted in FIG. 1A after further processing according to an embodiment. The semiconductor package 102 has been further processed with a fourth ILD layer 124 upon the third ILD layer 120, and patterning of the fourth ILD layer 124 has opened contact corridors for electrical bumps 126 upon selected electrical pillars 122.

In an embodiment, at least one embedded active device 128 and 130 is seated upon the electrical bumps 126 such that further processing will allow the embedded active devices 128 and 130 to communicate orthogonally through the package substrate 132 after it has been folded. In an embodiment, the thickness of the package substrate 132 ranges from 40 μm 100 μm. The orthogonal communication path shortens the signal length as well as improves resistivity issues and inductance issues, among others. Folding is illustrated in FIG. 1G.

Figure 1C:
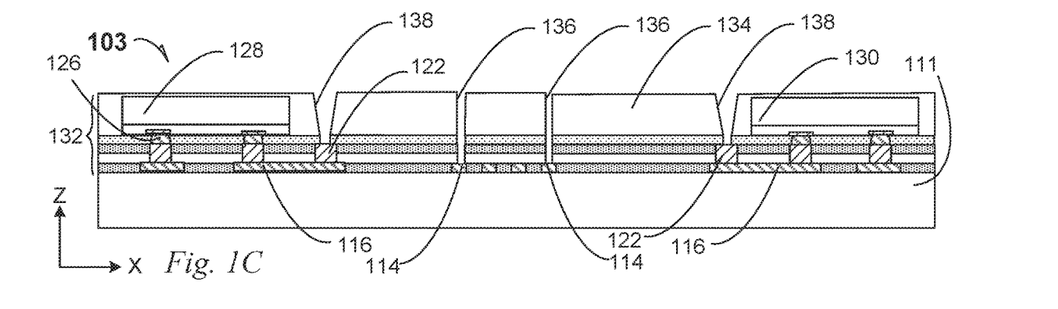
FIG. 1C is a cross-section elevation of the semiconductor package depicted in FIG. 1B after further processing according to an embodiment.

FIG. 1C is a cross-section elevation of the semiconductor package 102 depicted in FIG. 1B after further processing according to an embodiment. The semiconductor package 103 has been further processed by overmolding with an encapsulation material 134 and contact corridors have been opened through the encapsulation material 134. In an embodiment, the contact corridors are opened, such as a bond-pad opening contact corridor 136, as well as a stacked-via opening contact corridor 138. The bond-pad opening contact corridor 136 exposes a bond pad 114 that abuts the carrier 111. The stacked-via opening contact corridor 138 exposes an electrical pillar 122 that is situated on a trace 116.

Figure 1D:
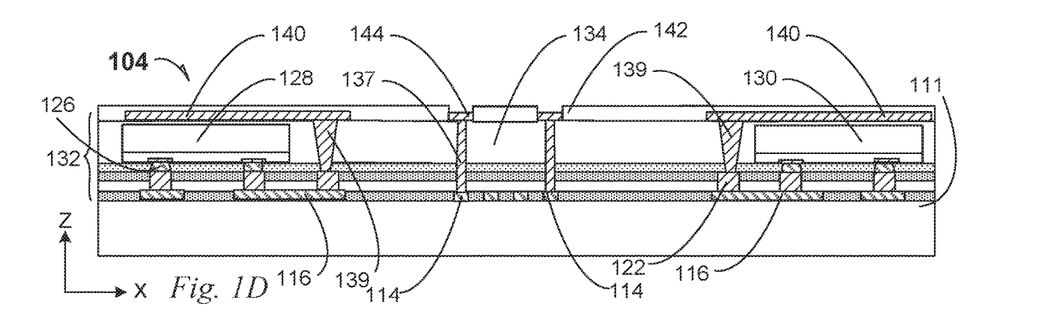
FIG. 1D is a cross-section elevation of the semiconductor package depicted in FIG. 1C after further processing according to an embodiment.

FIG. 1D is a cross-section elevation of the semiconductor package 103 depicted in FIG. 1C after further processing according to an embodiment. The semiconductor package 104 has been further processed by creating bond-pad vias 137 as well as stacked vias 139. After filling the vias 137 and 139, a stacked-via trace 140 is formed to contact a stacked via 139. After forming traces on the upper surface of the encapsulation material 134, a masking layer 142 is formed and opened to allow for a bond-pad 144 to contact the bond-pad via 137.

Figure 1E:
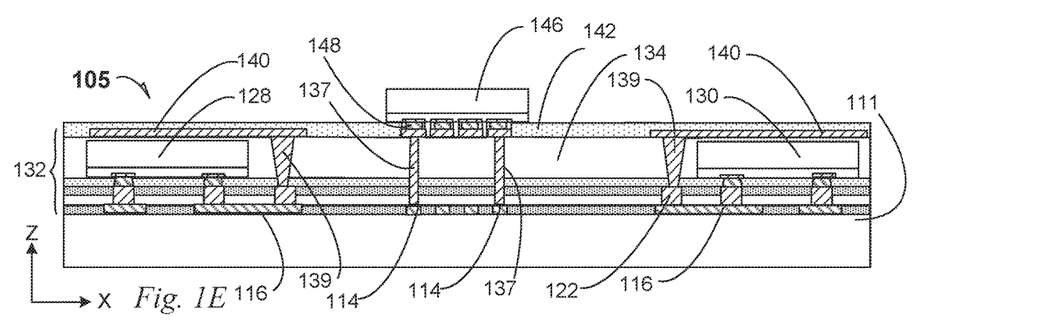
FIG. 1E is a cross-section elevation of the semiconductor package depicted in FIG. 1D after further processing according to an embodiment.

FIG. 1E is a cross-section elevation of the semiconductor package 104 depicted in FIG. 1D after further processing according to an embodiment. The semiconductor device package 105 has been further processed by seating a semiconductive device 146 upon electrical bumps 148 that have been bonded to connections on the top of the encapsulation material 134, including to connections that contact the bond-pad vias 137. In an embodiment, the semiconductive device 146 is a central processing unit (CPU) such as a processor manufactured by Intel Corporation of Santa Clara, Calif.

Figure 1F:
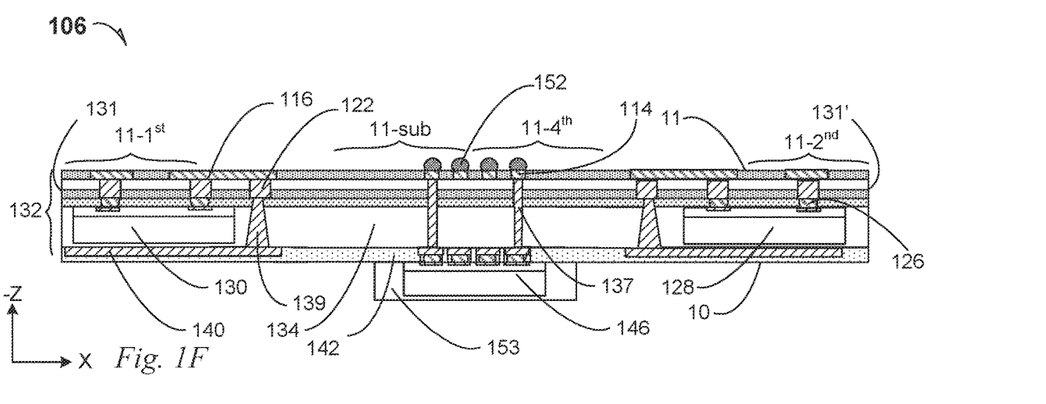
FIG. 1F is a cross-section elevation of the semiconductor device package depicted in FIG. 1E after further processing according to an embodiment.
Figure 1G:
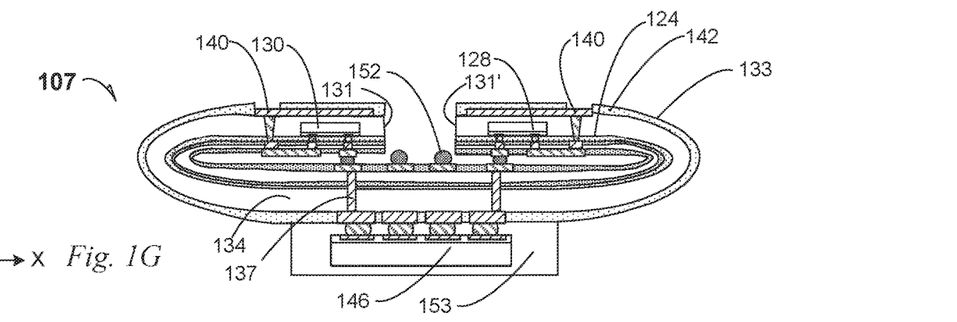
FIG. 1G is a cross-section elevation of the semiconductor device package depicted in FIG. 1F after further processing according to an embodiment.

FIG. 1F is a cross-section elevation of the semiconductor device package 105 depicted in FIG. 1E after further processing according to an embodiment. The semiconductor device package 106 has been further processed by removing the carrier 111 (see FIG. 1E) and the semiconductor package substrate 132 has been inverted (as indicated by negative-Z on the X-Z cross section). The semiconductor device package substrate 132 now exhibits a die side 10 and a land side 11, before folding as illustrated in FIG. 1G.

In an embodiment, solder paste bumps 152 are formed on the bond pads 114 as electrical bump precursors before folding the semiconductor device package substrate 132. Further processing will demonstrate folding of the semiconductor package substrate 132 such that opposite ends 131 and 131' of the semiconductor package substrate are deflected. Hereinafter, the ends 131 and 131' are referred to with respect to the closest portion of the land side 11 that is involved with semiconductor package substrate folding.

Before folding the semiconductor package substrate 132, several portions of the land side 11 are noted. A landside first portion 11-1$^{st}$ is spaced apart from a landside subsequent portion 11-sub. The package substrate end 131 is a first end 131. Similarly, a landside second portion 11-2$^{nd}$ is spaced apart from a landside fourth portion 11-4$^{th}$. The package substrate end 131' is a second end 131'. As a result of folding the semiconductor package substrate 132, a section of the landside 11 between the landside first portion 11-1$^{st}$ and the landside subsequent portion 11-sub, is folded and the two landside portions 11-1$^{st}$ and 11-sub will be mated. In other words, once the fold is completed, two landside portions are touching at least such as through an electrical bump. Similarly in an embodiment, as a result of folding, a section of the landside 11 between the landside second portion 11-2$^{nd}$ and the landside fourth portion 11-4$^{th}$, is folded and the two landside portions 11-2$^{nd}$ and 11-4$^{th}$ will be mated. In an embodiment, the result of folding is depicted in FIG. 1G.

FIG. 1G is a cross-section elevation of the semiconductor device package 106 depicted in FIG. 1F after further processing according to an embodiment. The semiconductor device package 107 has been further processed by folding the semiconductor package substrate 132, seen in FIG. 1F into the folded semiconductor package substrate 133. The semiconductor package substrate 132, after folding, may also be referred to as a deflected semiconductor package substrate 133. The X-Z coordinates relate to the same semiconductive device 146 orientation depicted in FIG. 1F, although a portion of the folded semiconductor package substrate 133 matches orientation seen in FIGS. 1A through 1E.

As illustrated, the embedded active device 130 is coupled to the semiconductive device 146 by a substantially orthogonal electrical path through the folded semiconductor package substrate 133 in the Z-direction. The substantially orthogonal electrical path represents a shorter electrical path than were the active device 130 to be disposed on a flat package substrate. Further, where through-silicon via (TSV) technology may be used to directly stack, e.g. an active device 130 and a CPU 146, the cost and difficulty of mating the two devices by TSVs is not undertaken.

Figure 1H:
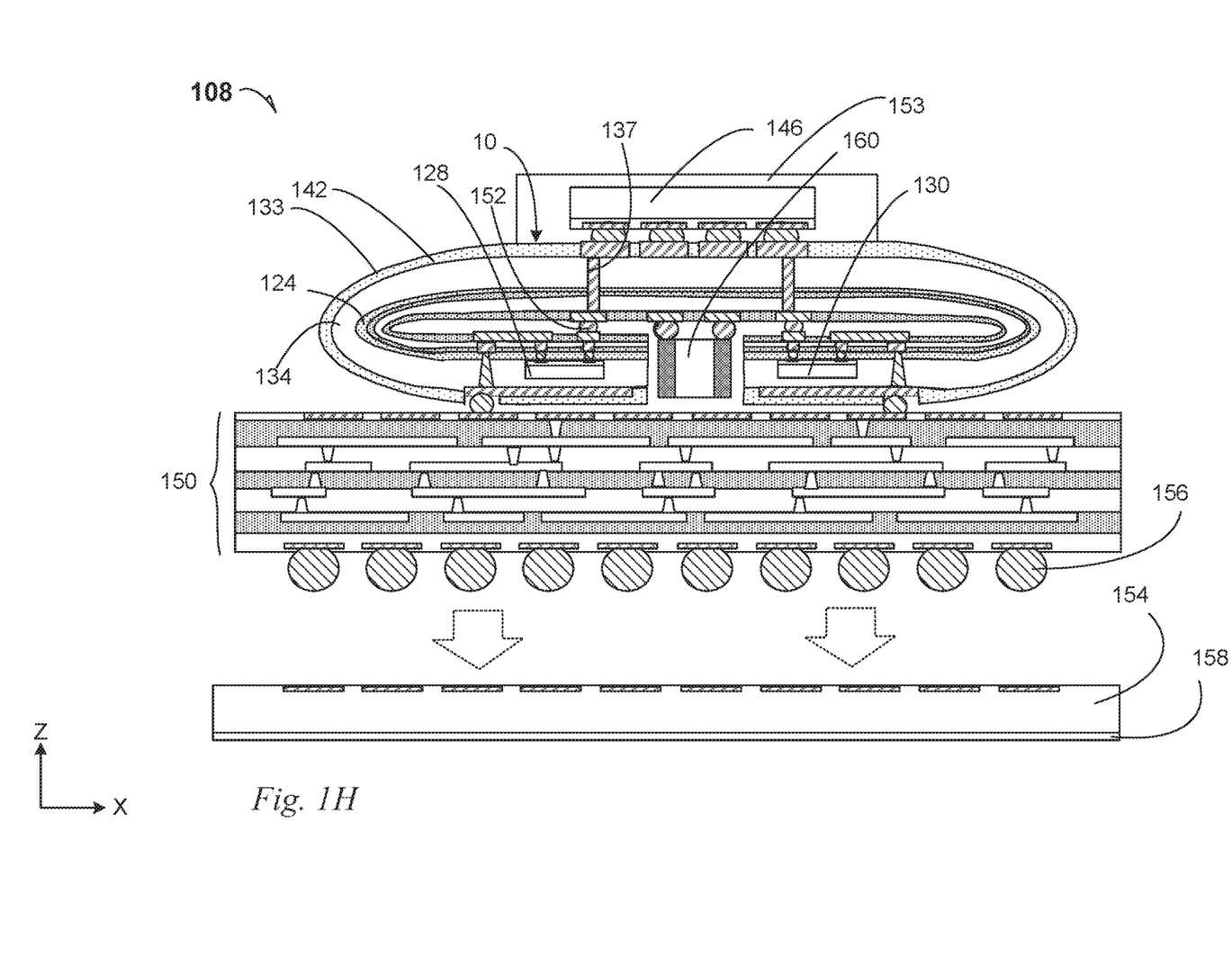
FIG. 1H is a cross-section elevation of the folded semiconductor device package depicted in FIG. 1F after further processing according to an embodiment.

FIG. 1H is a cross-section elevation of the folded semiconductor device package 107 depicted in FIG. 1F after further processing according to an embodiment. The structure has again been inverted to reveal a folded-package substrate semiconductor device apparatus 108. Inversion of the apparatus 108, compared to the illustration in FIG. 1G is indicated by the X-Z cross-section. In an embodiment, the folded semiconductor package substrate 133 has been mounted onto a board 150 and an encapsulation cover 153 has been applied over the semiconductive device 146. In an embodiment, the board 150 is a motherboard such as for a computing system. In an embodiment, the board 150 is mounted onto an external board 154 that has bond pads to mate with a ball-grid array 156. In an embodiment, the external board 154 includes a physical and electrical protective layer 158 such as an external shell 158 for a handheld computing system such as a mobile device. In an embodiment, the protective layer 158 is an external shell stationary computing system.

In an embodiment, a passive device 160 such as a decoupling capacitor 160 is mounted below the semiconductive die 146 and it is located between the folded ends 131 and 131' (see FIGS. 1F and 1G). The passive device 160 is essentially seated directly below the semiconductive device 146 and within a virtual recess created by the space between the folded ends 131 and 131'.

It can be observed from FIG. 1H, that an orthogonal electrical coupling is achieved through the folded semiconductor package substrate 133 after the folding has been accomplished. "Orthogonal" uses the X-Z cross section for definition, where electrical coupling passes substantially linearly along the Z-direction through portions of the folded semiconductor package substrate 133, when observed in the X-Z cross section. Deviation from linearity, but retaining the orthogonal interconnection path, is limited to incidental bond pad widths along the substantially linear interconnection path. Accordingly, an orthogonal electrical coupling can be traced, starting at the die side 10 of the folded semiconductor package substrate 133 at a via 137, with incidental bond pad and electrical bump couplings, through the subsequent portion of the land side, through the first portion of the land side, with incidental bond pad and electrical bump couplings and terminating at the first embedded device 128.

In an embodiment, the folded-package substrate semiconductor device apparatus 108 is part of a system-in-package (SIP) apparatus such as a CPU 146, a memory die 128 and a platform controller hub (PCH) 130. Where a single cross section is illustrated, a different cross section (into the plane of the drawing) would reveal the CPU 146, and other devices depicted in the locations of the active devices 128 and 130 would reveal a second memory die in the location of the device 128, and a baseband processor in the location of the device 130.

Figure 2:
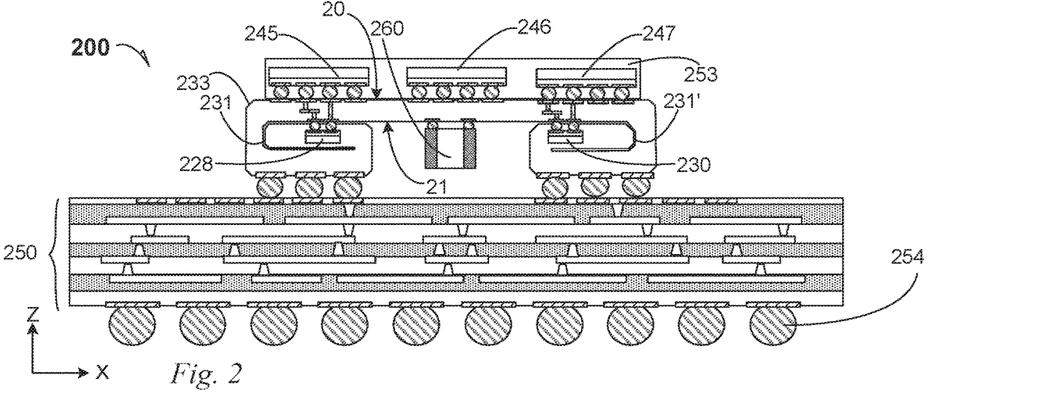
FIG. 2 is a cross-section elevation of a folded-package substrate semiconductor device apparatus according to an embodiment.

FIG. 2 is a cross-section elevation of a folded-package substrate semiconductor device apparatus 200 according to an embodiment. A folded semiconductor package substrate 233 includes a die-side surface 20 and a land-side surface 21. Because the folded semiconductor package substrate 233 is no longer substantially planar, the land side 21 may still be referred to as the land side 21, or it may be referred to as a land-side surface 21. A semiconductive die 246 such as a CPU 246 is mounted on the folded semiconductor package substrate 233 on the die-side surface 20.

At least one embedded active device 228 and 230 are disposed orthogonal to semiconductive devices 245 and 247, respectively. Orthogonal electrical coupling is achieved through the folded semiconductor package substrate 233 between the embedded device 228 and the die-side mounted semiconductor device 245, and between the embedded device 230 and the die-side mounted semiconductor device 247. The orthogonal coupling is achieved by the folded architecture of the semiconductor package substrate 233. In an embodiment, the several devices 245, 246 and 247 are overmolded by a cover 253. In an embodiment, the device 246 is a CPU, the device 245 is a PCH, the device 247 is a memory chip such as a dynamic random-access (DRAM), the device 230 is a fully integrated voltage regulator (FiVR), and the device 228 is a solid-state memory disk drive (SSD). Other uses for the several devices may be achieved depending upon a given application.

In an embodiment as illustrated, the respective folded first and second ends 231 and 231' have been convolution folded such that the first and second ends 231 and 231' are also embedded within the overall folded semiconductor package substrate 233. In other words, the first end 231 is embedded within the overall folded semiconductor package substrate 233 as it abuts a portion of the land-side surface 21 (or in context of a folded semiconductor package substrate, it abuts the land side 21). Similarly in an embodiment, the second end 231' is embedded within the overall folded semiconductor package substrate 233 as it abuts a portion of the land-side surface 21.

In an embodiment, a passive device 260 is mounted on the land side 21 of the semiconductor package substrate 233 within a virtual recess that is created by the folded portions of the package substrate 233.

Figure 3:
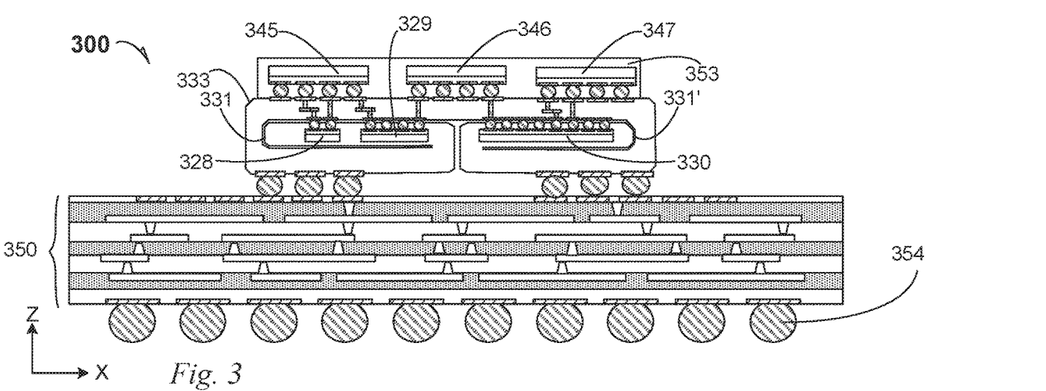
FIG. 3 is a cross-section elevation of a folded-package substrate semiconductor device apparatus according to an embodiment.

FIG. 3 is a cross-section elevation of a folded-package substrate semiconductor device apparatus 300 according to an embodiment. A semiconductive die 346 such as a CPU is mounted on a folded semiconductor package substrate 333, and at least one embedded active device 328, 329 and 330 are disposed orthogonal to semiconductive devices 345 and 346 and 347, respectively. In an embodiment, orthogonal electrical coupling is achieved through the folded semiconductor package substrate 333 between the embedded device 328 and the die-side mounted semiconductor device 345. In an embodiment, orthogonal electrical coupling is achieved through the folded semiconductor package substrate 333 between the embedded device 329 and the die-side mounted semiconductor devices 345 and 346. In an embodiment, orthogonal electrical coupling is achieved through the folded semiconductor package substrate 333 between the embedded device 330 and the die-side mounted semiconductor devices 346 and 347. In an embodiment, the several devices 345, 346 and 347 are overmolded by a cover 353.

As illustrated, the embedded device 329 acts as a silicon bridge 329 for orthogonal communication between the semiconductor devices 345 and 346. In an embodiment, the semiconductor device 346 acts as a silicon bridge 346 for orthogonal communication between the embedded devices 329 and 330. In an embodiment, the embedded device 330 acts as a silicon bridge 330 for orthogonal communication between the semiconductor devices 346 and 347. The several orthogonal couplings are achieved by the folded architecture of the semiconductor package substrate 333.

In an embodiment as illustrated, the respective first and second folded ends 331 and 331' have been convolution folded such that the respective first and second ends 331 and 331' are also embedded within the overall semiconductor package substrate 333, and the folded semiconductor package substrate 333 leaves virtually no space for a passive device on the land side, as compared to space for the passive device 260 depicted in FIG. 2.

The folded semiconductor package substrate 333 is mounted on a board 350, which in an embodiment, has a ball-grid array 354 for further mounting within a computing system. Where a system-in-package is constructed, the several devices may include a CPU 346, an embedded memory controller hub (MCH) 330, a memory die 347, an embedded baseband processor 329, a transceiver 345, and the device 328 is an embedded integrated passive device (IPD) 328 such as a balun for the transceiver 345.

Figure 4:
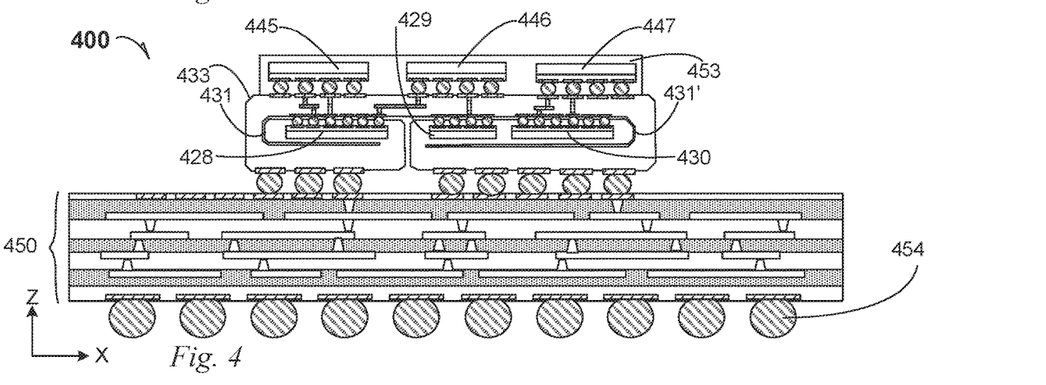
FIG. 4 is a cross-section elevation of an asymmetrically folded semiconductor package apparatus according to an embodiment.

FIG. 4 is a cross-section elevation of an asymmetrically folded semiconductor package apparatus 400 according to an embodiment. A semiconductive die 446 such as a CPU is mounted on an asymmetrically folded semiconductor package substrate 433, and at least one embedded active device 428, 429 and 430 are disposed orthogonal to semiconductive devices 445, 446 and 447, respectively.

In an embodiment, orthogonal electrical coupling is achieved through the asymmetrically folded semiconductor package substrate 433 between the embedded device 428 and the die-side mounted semiconductor device 445, while the die-side mounted semiconductor device 446 is laterally and orthogonally connected to the embedded device 428. In an embodiment, orthogonal electrical coupling is achieved through the asymmetrically folded semiconductor package substrate 433 between the embedded device 429 and the die-side mounted semiconductor device 446. In other words, the first portion fold length that houses the embedded device 428, is shorter than the subsequent portion fold length that houses the embedded device 430. In an embodiment, orthogonal electrical coupling is achieved through the asymmetrically folded semiconductor package substrate 433 between the embedded device 430 and the die-side mounted semiconductor device 447. In an embodiment, the several devices 445, 446 and 447 are overmolded by a cover 453.

As illustrated, the semiconductor device 446 acts as a silicon bridge 446 for communication between the embedded devices 428 and 429. The several orthogonal couplings are achieved by the asymmetrically folded architecture of the semiconductor package substrate 433.

In an embodiment as illustrated, the respective first and second folded ends 431 and 431' have been convolution folded such that respective first and second ends 431 and 431' are also embedded within the overall folded semiconductor package substrate 433, and the folded semiconductor package substrate 433 leaves virtually no space for a passive device on the land side, as compared to space for the passive device 260 depicted in FIG. 2. Asymmetrical folding is exhibited where the first end 431 has a shorter X-direction-length fold than the second end 431'.

The folded semiconductor package substrate 433 is mounted on a board 450, which in an embodiment, has a ball-grid array 454 for further mounting within a computing system.

Figure 5:
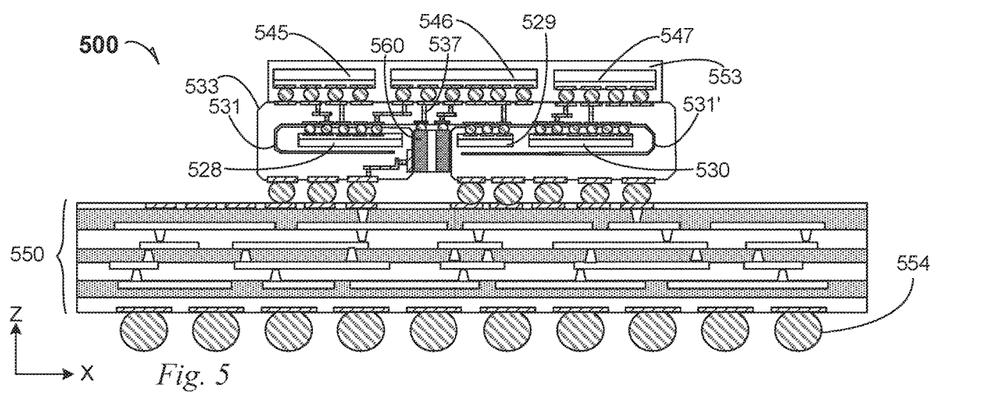
FIG. 5 is a cross-section elevation of an asymmetrically folded semiconductor package apparatus 500 according to an embodiment.

FIG. 5 is a cross-section elevation of an asymmetrically folded semiconductor package apparatus 500 according to an embodiment. A semiconductive die 546 such as a CPU is mounted on an asymmetrically folded semiconductor package substrate 533, and at least one embedded active device 528, 529 and 530 is disposed orthogonal to semiconductive devices 545, 546 and 547, respectively. In an embodiment, orthogonal electrical coupling is achieved through the asymmetrically folded semiconductor package substrate 533 between the embedded device 528 and the die-side mounted semiconductor device 545, while the die-side mounted semiconductor device 546 is laterally and orthogonally connected to the embedded device 528. In an embodiment, orthogonal electrical coupling is achieved through the asymmetrically folded semiconductor package substrate 533 between the embedded device 529 and the die-side mounted semiconductor device 546. In an embodiment, orthogonal electrical coupling is achieved through the asymmetrically folded semiconductor package substrate 533 between the embedded device 530 and the die-side mounted semiconductor device 547. In an embodiment, the several devices 545, 546 and 547 are overmolded by a cover 553.

As illustrated, the semiconductor device 546 acts as a silicon bridge 546 for communication between the embedded devices 528 and 529. The several orthogonal- and lateral couplings are achieved by the asymmetrically folded architecture of the semiconductor package substrate 533.

In an embodiment as illustrated, the respective first and second folded ends 531 and 531' have been convolution folded such that the respective first and second ends 531 and 531' are also embedded within the overall semiconductor package substrate 533, and additionally, the folded semiconductor package substrate 533 leaves a virtual recess for a passive device 560 on the land side. In an embodiment, the semiconductor device 546 is a CPU and the passive device 560 is a decoupling capacitor with an orthogonal via 537 that acts as a power rail 561 that is orthogonally coupled into the semiconductive device 546.

Asymmetrical folding is exhibited where the first end 531 has a shorter X-direction-length fold than the second end 531'.

The folded semiconductor package substrate 533 is mounted on a board 550, which in an embodiment, has a ball-grid array 554 for further mounting within a computing system.

Figure 6:
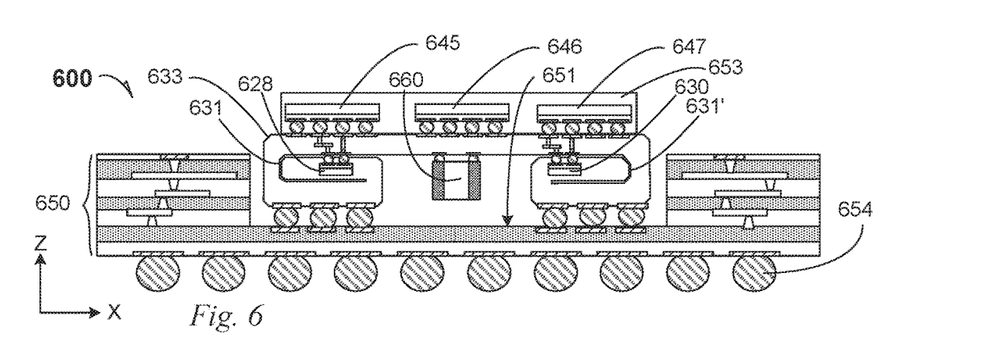
FIG. 6 is a cross-section elevation of a folded semiconductor package apparatus according to an embodiment.

FIG. 6 is a cross-section elevation of a folded semiconductor package apparatus 600 according to an embodiment. In an embodiment, a folded package substrate 633 has been mounted onto a board 650 within a board recess 651 of the board 650. In an embodiment, the board 650 is a motherboard such as for a computing system. In an embodiment, the board 650 includes a ball-grid array 654 for further connection to a computing system.

In an embodiment, a passive device 660 such as a decoupling capacitor 660 is mounted below a semiconductive die 646 and it is located between the respective first and second folded ends 631 and 631', which are also convolution folded and embedded. The passive device 660 is essentially seated directly below the semiconductive device 646 and within a virtual recess created by the space between the respective first and second folded ends 631 and 631'. By seating the folded semiconductor package substrate 633 into the board recess 651, a lower overall Z-height is achieved in the folded semiconductor package 600, while achieving several orthogonal couplings between die-side mounted semiconductor devices and embedded devices. For example, a die-side mounted semiconductor device 645 has orthogonal coupling to an embedded device 628. In an example embodiment, a die-side mounted semiconductor device 647 has orthogonal coupling to an embedded device 630.

In an embodiment as illustrated, the respective first and second folded ends 631 and 631' have been convolution folded such that the respective first and second ends 631 and 631' are also embedded within the overall semiconductor package substrate 633, and additionally, the folded semiconductor package substrate 633 leaves a virtual recess for a passive device 660 on the land side.

Figure 7:
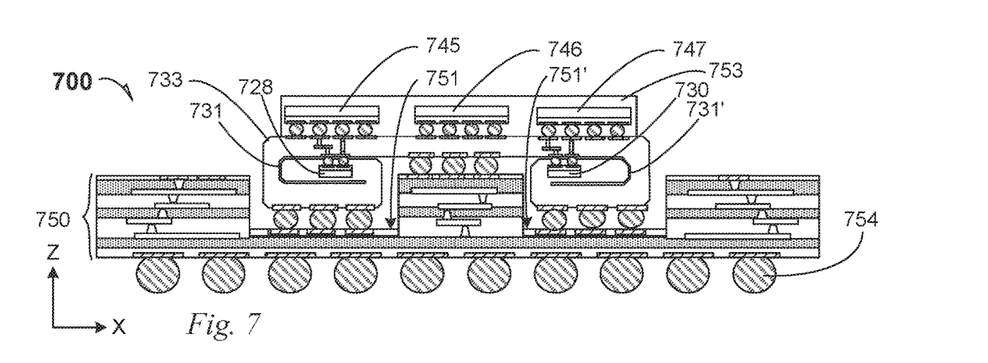
FIG. 7 is a cross-section elevation of a folded semiconductor package apparatus according to an embodiment.

FIG. 7 is a cross-section elevation of a folded semiconductor package apparatus 700 according to an embodiment. In an embodiment, a folded package substrate 733 has been mounted onto a board 750 within board recesses 751 and 751' of the board 750. In an embodiment, the board 750 is a motherboard such as for a computing system. In an embodiment, the board 750 includes a ball-grid array 754 for further connection to a computing system.

In an embodiment, a center portion of the board 650 between the recesses 751 and 751', provides central support below the semiconductor device 746 and coupling for the semiconductor device 746.

By seating the folded semiconductor package substrate 733 into the board recesses 751 and 751', a lower overall Z-height is achieved in the folded semiconductor package 700, while achieving several orthogonal couplings between die-side mounted semiconductor devices and embedded devices. For example, a die-side mounted semiconductor device 745 has orthogonal coupling to an embedded device 728. In an example embodiment, a die-side mounted semiconductor device 747 has orthogonal coupling to an embedded device 730.

In an embodiment as illustrated, the respective first and second folded ends 731 and 731' have been convolution folded such that the respective first and second ends 731 and 731' are also embedded within the overall semiconductor package substrate 733, and additionally, the folded semiconductor package substrate 733 leaves a virtual recess to accommodate the central region of the board 750 for electrical coupling such as signal transmission and power delivery.

Figure 8:
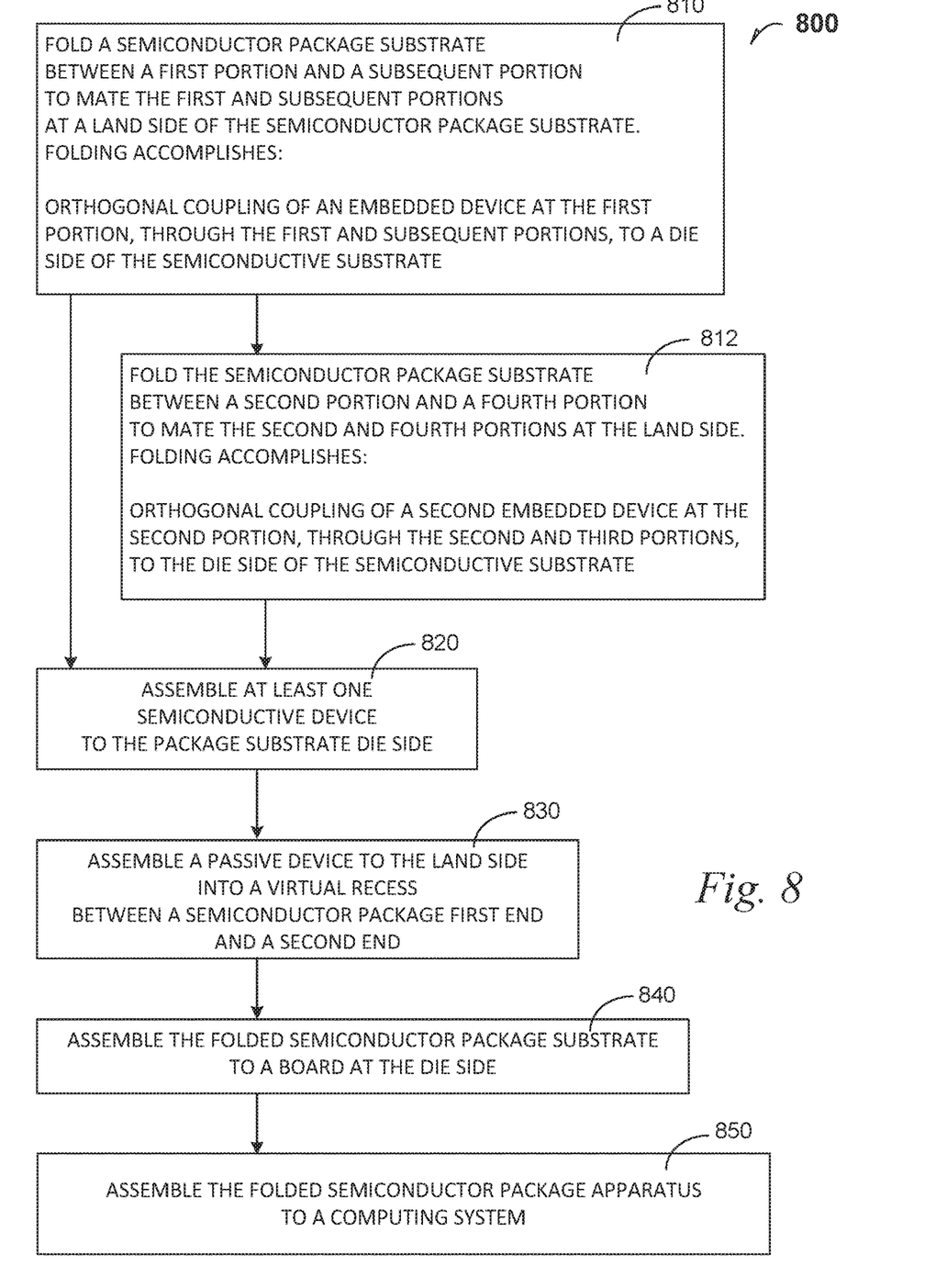
FIG. 8 is a process flow diagram according to an embodiment.

FIG. 8 is a process flow diagram 800 according to an embodiment.

At 810, the process includes folding a semiconductor package substrate between a first portion and a subsequent portion to mate the first and subsequent portions at a land side of the semiconductor package substrate.

At 812, the process includes folding the semiconductor package substrate between a second portion and a fourth portion to mate the second and fourth portions at the land side.

At 820, the process includes assembling at least one semiconductive device to the package substrate die side.

At 830, the process includes assembling a passive device into a virtual recess that is formed between the first and the second ends of the folded semiconductor package substrate.

At 840, the process includes assembling the folded semiconductor package substrate to a board at the die side.

At 850, the process includes assembling the folded semiconductor package apparatus to a computing system.

Figure 9:
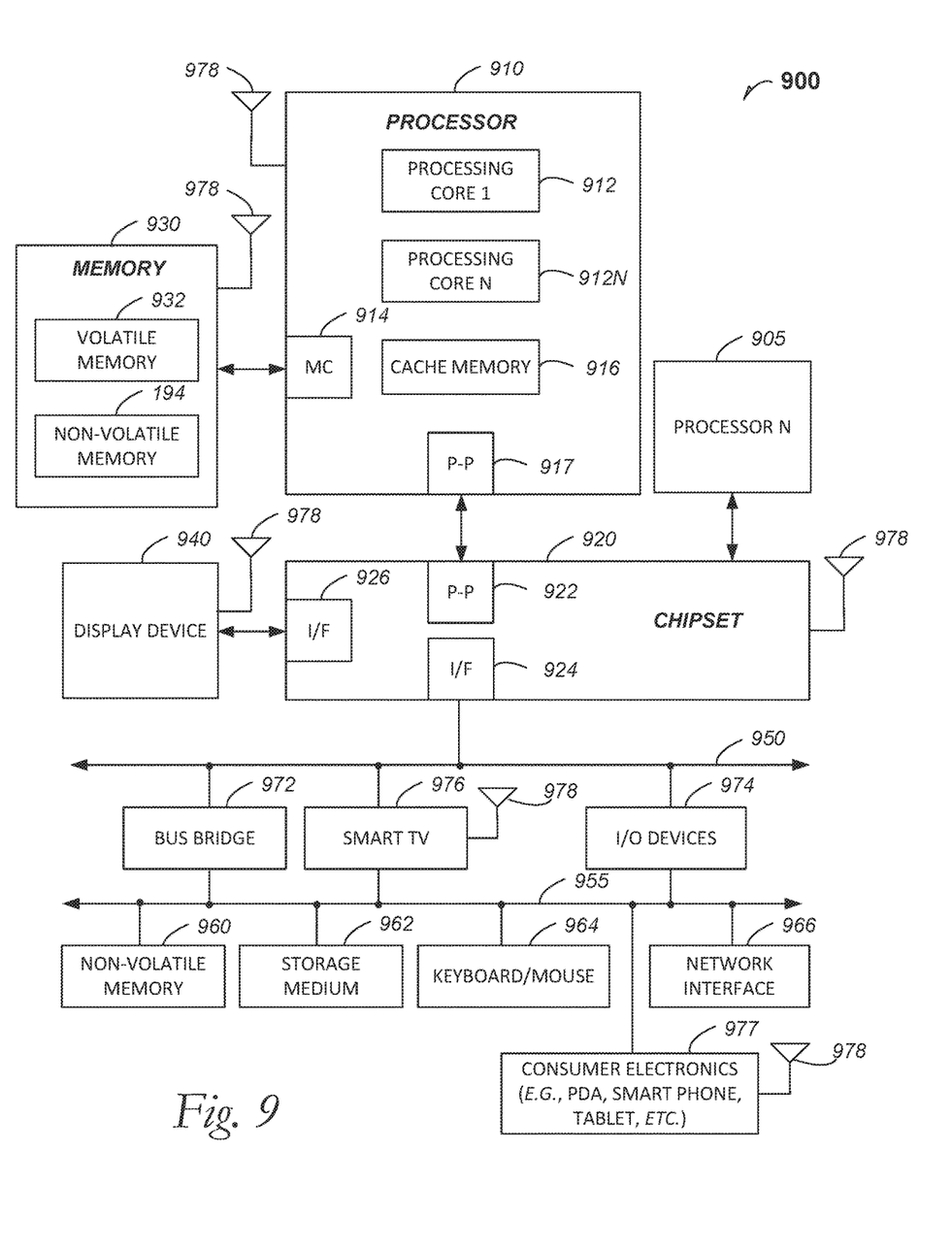
FIG. 9 is included to show an example of a higher-level device application for the disclosed embodiments.

FIG. 9 is included to show an example of a higher-level device application for the disclosed embodiments. The folded semiconductor package apparatus embodiments may be found in several parts of a computing system. In an embodiment, the folded semiconductor package apparatus is part of a communications apparatus such as is affixed to a cellular communications tower. In an embodiment, a computing system 900 includes, but is not limited to, a desktop computer. In an embodiment, a system 900 includes, but is not limited to a laptop computer. In an embodiment, a system 900 includes, but is not limited to a netbook. In an embodiment, a system 900 includes, but is not limited to a tablet. In an embodiment, a system 900 includes, but is not limited to a notebook computer. In an embodiment, a system 900 includes, but is not limited to a personal digital assistant (PDA). In an embodiment, a system 900 includes, but is not limited to a server. In an embodiment, a system 900 includes, but is not limited to a workstation. In an embodiment, a system 900 includes, but is not limited to a cellular telephone. In an embodiment, a system 900 includes, but is not limited to a mobile computing device. In an embodiment, a system 900 includes, but is not limited to a smart phone. In an embodiment, a system 900 includes, but is not limited to an internet appliance. Other types of computing devices may be configured with the microelectronic device that includes folded semiconductor package apparatus embodiments.

In an embodiment, the processor 910 has one or more processing cores 912 and 912N, where 912N represents the Nth processor core inside processor 910 where N is a positive integer. In an embodiment, the electronic device system 900 using a folded semiconductor package apparatus embodiment that includes multiple processors including 910 and 905, where the processor 905 has logic similar or identical to the logic of the processor 910. In an embodiment, the processing core 912 includes, but is not limited to, pre-fetch logic to fetch instructions, decode logic to decode the instructions, execution logic to execute instructions and the like. In an embodiment, the processor 910 has a cache memory 916 to cache at least one of instructions and data for the folded semiconductor package apparatus in the system 900. The cache memory 916 may be organized into a hierarchal structure including one or more levels of cache memory.

In an embodiment, the processor 910 includes a memory controller 914, which is operable to perform functions that enable the processor 910 to access and communicate with memory 930 that includes at least one of a volatile memory 932 and a non-volatile memory 934. In an embodiment, the processor 910 is coupled with memory 930 and chipset 920. The processor 910 may also be coupled to a wireless antenna 978 to communicate with any device configured to at least one of transmit and receive wireless signals. In an embodiment, the wireless antenna interface 978 operates in accordance with, but is not limited to, the IEEE 802.11 standard and its related family, Home Plug AV (HPAV), Ultra Wide Band (UWB), Bluetooth, WiMax, or any form of wireless communication protocol.

In an embodiment, the volatile memory 932 includes, but is not limited to, Synchronous Dynamic Random Access Memory (SDRAM), Dynamic Random Access Memory (DRAM), RAMBUS Dynamic Random Access Memory (RDRAM), and/or any other type of random access memory device. The non-volatile memory 934 includes, but is not limited to, flash memory, phase change memory (PCM), read-only memory (ROM), electrically erasable programmable read-only memory (EEPROM), or any other type of non-volatile memory device.

The memory 930 stores information and instructions to be executed by the processor 910. In an embodiment, the memory 930 may also store temporary variables or other intermediate information while the processor 910 is executing instructions. In the illustrated embodiment, the chipset 920 connects with processor 910 via Point-to-Point (PtP or P-P) interfaces 917 and 922. Either of these PtP embodiments may be achieved using a folded semiconductor package apparatus embodiment as set forth in this disclosure. The chipset 920 enables the processor 910 to connect to other elements in the folded semiconductor package apparatus embodiments in a system 900. In an embodiment, interfaces 917 and 922 operate in accordance with a PtP communication protocol such as the Intel® QuickPath interconnect (QPI) or the like. In other embodiments, a different interconnect may be used.

In an embodiment, the chipset 920 is operable to communicate with the processor 910, 905N, the display device 940, and other devices 972, 976, 974, 960, 962, 964, 966, 977, etc. The chipset 920 may also be coupled to a wireless antenna 978 to communicate with any device configured to at least do one of transmit and receive wireless signals.

The chipset 920 connects to the display device 940 via the interface 926. The display 940 may be, for example, a liquid crystal display (LCD), a plasma display, cathode ray tube (CRT) display, or any other form of visual display device. In an embodiment, the processor 910 and the chipset 920 are merged into a folded semiconductor package apparatus in a system. Additionally, the chipset 920 connects to one or more buses 950 and 955 that interconnect various elements 974, 960, 962, 964, and 966. Buses 950 and 955 may be interconnected together via a bus bridge 972 such as at least one folded semiconductor package apparatus embodiment. In an embodiment, the chipset 920, via interface 924, couples with a non-volatile memory 960, a mass storage device(s) 962, a keyboard/mouse 964, a network interface 966, smart TV 976, and the consumer electronics 977, etc.

In an embodiment, the mass storage device 962 includes, but is not limited to, a solid state drive, a hard disk drive, a universal serial bus flash memory drive, or any other form of computer data storage medium. In one embodiment, the network interface 966 is implemented by any type of well-known network interface standard including, but not limited to, an Ethernet interface, a universal serial bus (USB) interface, a Peripheral Component Interconnect (PCI) Express interface, a wireless interface and/or any other suitable type of interface. In one embodiment, the wireless interface operates in accordance with, but is not limited to, the IEEE 802.11 standard and its related family, Home Plug AV (HPAV), Ultra Wide Band (UWB), Bluetooth, WiMax, or any form of wireless communication protocol.

While the modules shown in FIG. 9 are depicted as separate blocks within the folded semiconductor package apparatus embodiment in a computing system 900, the functions performed by some of these blocks may be integrated within a single semiconductor circuit or may be implemented using two or more separate integrated circuits. For example, although cache memory 916 is depicted as a separate block within processor 910, cache memory 916 (or selected aspects of 916) can be incorporated into the processor core 912.

Where useful, the computing system 900 may have a broadcasting structure interface such as for affixing the folded semiconductor package apparatus to a cellular tower.

To illustrate the folded semiconductor package apparatus embodiments and methods disclosed herein, a non-limiting list of examples is provided herein:

Example 1 is a semiconductor package substrate, comprising: a die side and a land side; a fold in the semiconductor package substrate, wherein a first portion of the land side and a subsequent portion of the land side are mated; and an embedded device disposed within the first portion, wherein the embedded device exhibits orthogonal electrical coupling through the first portion with at least one via, beginning at the semiconductor package substrate die side at the subsequent portion, through the first portion, and terminating at the embedded device.

In Example 2, the subject matter of Example 1 optionally includes wherein the embedded device is a first embedded device, further including: a fold in the semiconductor package substrate, wherein a second portion of the land side and a fourth portion of the land side are mated; and a second embedded device disposed within the second portion, wherein the second embedded device exhibits orthogonal electrical coupling through the second portion with at least one via, beginning at the semiconductor package substrate die side at the fourth portion, through the second portion, and terminating at the second embedded device.

In Example 3, the subject matter of any one or more of Examples 1-2 optionally include a semiconductive device disposed on the die side, wherein the orthogonal electrical coupling from the first embedded device further orthogonally couples to the semi conductive device, and wherein the orthogonal electrical coupling from the second embedded device further orthogonally couples to the semiconductive device.

In Example 4, the subject matter of any one or more of Examples 1-3 optionally include wherein the embedded device is a first embedded device, further including: a fold in the semiconductor package substrate, wherein a second portion of the land side and a fourth portion of the land side are mated; a second embedded device disposed within the second portion, wherein the second embedded device exhibits orthogonal electrical coupling through the second portion with at least one via, beginning at the semiconductor package substrate die side at the fourth portion, through the second portion, and terminating at the second embedded device; and a virtual recess on the land side, formed at a first end of the semiconductor package substrate that includes the first portion and at a second end of semiconductor package substrate that includes the second portion.

In Example 5, the subject matter of Example 4 optionally includes a passive device seated in the virtual recess upon the land side.

In Example 6, the subject matter of any one or more of Examples 1-5 optionally include wherein a first end of the semiconductor package substrate includes the first portion, and wherein the first end of the semiconductor package substrate abuts a portion of the land side.

In Example 7, the subject matter of Example 6 optionally includes wherein the embedded device is a first embedded device, further including: a fold in the semiconductor package substrate, wherein a second portion of the land side and a fourth portion of the land side are mated; a second embedded device disposed within the second portion, wherein the second embedded device exhibits orthogonal electrical coupling through the second portion with at least one via, beginning at the semiconductor package substrate die side at the fourth portion, through the second portion, and terminating at the second embedded device; and wherein a second end of the semiconductor package substrate includes the second portion, and wherein the second end abuts a portion of the land side.

In Example 8, the subject matter of Example 7 optionally includes a passive device seated on the land side between the first end and the second end.

In Example 9, the subject matter of any one or more of Examples 7-8 optionally include wherein the fold including the first portion is longer than the fold including the second portion.

In Example 10, the subject matter of any one or more of Examples 7-9 optionally include wherein the fold including the first portion and the fold including the second portion are symmetrical.

In Example 11, the subject matter of any one or more of Examples 1-10 optionally include a board, wherein the semiconductor package substrate first portion is seated on the board by the die side.

In Example 12, the subject matter of Example 11 optionally includes wherein the first portion is seated within a recess within the board.

In Example 13, the subject matter of any one or more of Examples 11-12 optionally include wherein the embedded device is a first embedded device, further including: a fold in the semiconductor package substrate, wherein a second portion of the land side and a fourth portion of the land side are mated; a second embedded device disposed within the second portion, wherein the second embedded device exhibits orthogonal electrical coupling through the second portion with at least one via, beginning at the semiconductor package substrate die side at the fourth portion, through the second portion, and terminating at the second embedded device; wherein the first portion is seated within a first recess within the board; and wherein the second portion is seated within a second recess within the board.

In Example 14, the subject matter of any one or more of Examples 11-13 optionally include wherein the embedded device is a first embedded device, further including: a fold in the semiconductor package substrate, wherein a second portion of the land side and a fourth portion of the land side are mated; a second embedded device disposed within the second portion, wherein the second embedded device exhibits orthogonal electrical coupling through the second portion with at least one via, beginning at the semiconductor package substrate die side at the fourth portion, through the second portion, and terminating at the second embedded device; and a board, wherein the semiconductor package substrate first and second portions are seated on the board by the die side.

Example 15 is a method of forming a folded semiconductive package substrate, comprising: folding a semi conductive package substrate that includes a die side and a land side, wherein folding includes folding a first portion of the land side to mate with a subsequent portion of the land side, wherein the first portion of the land side carries an embedded device, and wherein the embedded device exhibits orthogonal electrical coupling with at least one via, beginning at the die side, through the subsequent portion of the land side and through the first portion of the land side.

In Example 16, the subject matter of Example 15 optionally includes seating a semiconductive device on the die side, wherein the orthogonal electrical coupling further couples to the semiconductive device.

In Example 17, the subject matter of any one or more of Examples 15-16 optionally include wherein the embedded device is a first embedded device, further including: folding the semiconductor package substrate between a second portion to mate with a fourth portion of the land side, wherein the second portion of the land side carries a second embedded device, and wherein the second embedded device exhibits orthogonal electrical coupling with at least one via beginning at the die side, through the fourth portion of the land side and through the second portion of the land side.

In Example 18, the subject matter of Example 17 optionally includes seating a semiconductive device on the die side, wherein the orthogonal electrical coupling from the first embedded device further couples to the semiconductive device, and wherein the orthogonal electrical coupling from the second embedded device further couples to the semiconductive device.

In Example 19, the subject matter of any one or more of Examples 17-18 optionally include wherein folding results in a virtual recess at a first end of the semiconductor package substrate that includes the first portion and at a second end of semiconductor package substrate that includes the second portion, further including: seating a passive device in the virtual recess upon the land side.

In Example 20, the subject matter of any one or more of Examples 15-19 optionally include seating the folded semiconductor package substrate onto a board on the die side that is mated to the first portion.

Example 21 is a computing device, comprising: a die side and a land side; a semiconductive device disposed on the die side; a fold in the semiconductor package substrate, wherein a first portion of the land side and a subsequent portion of the land side are mated; a first embedded device disposed within the first portion, wherein the first embedded device exhibits orthogonal electrical coupling through the first portion with at least one via, beginning at the semiconductive device disposed on the die side, through the subsequent portion, through the first portion, and terminating at the first embedded device; a fold in the semiconductor package substrate, wherein a second portion of the land side and a fourth portion of the land side are mated; a second embedded device disposed within the second portion, wherein the second embedded device exhibits orthogonal electrical coupling through the second portion with at least one via, beginning semiconductive device disposed on the die side, through the fourth portion, through the second portion, and terminating at the second embedded device; a board onto which the folded semiconductor package substrate is mounted; and an external shell coupled to the board.

In Example 22, the subject matter of Example 21 optionally includes at least one additional semiconductor device disposed on the die side.

The above detailed description includes references to the accompanying drawings, which form a part of the detailed description. The drawings show, by way of illustration, specific embodiments in which the invention can be practiced. These embodiments are also referred to herein as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In the event of inconsistent usages between this document and any documents so incorporated by reference, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

Method examples described herein can be machine or computer-implemented at least in part. Some examples can include a computer-readable medium or machine-readable medium encoded with instructions operable to configure an electrical device to perform methods as described in the above examples. An implementation of such methods can include code, such as microcode, assembly language code, a higher-level language code, or the like. Such code can include computer readable instructions for performing various methods. The code may form portions of computer program products. Further, in an example, the code can be tangibly stored on one or more volatile, non-transitory, or non-volatile tangible computer-readable media, such as during execution or at other times. Examples of these tangible computer-readable media can include, but are not limited to, hard disks, removable magnetic disks, removable optical disks (e.g., compact disks and digital video disks), magnetic cassettes, memory cards or sticks, random access memories (RAMs), read only memories (ROMs), and the like.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R. § 1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description as examples or embodiments, with each claim standing on its own as a separate embodiment, and it is contemplated that such embodiments can be combined with each other in various combinations or permutations. The scope of the disclosed embodiments should be determined with reference to the appended claims, along with the full scope of equivalents to which such claims are entitled.

The invention claimed is:

1. A semiconductor package substrate, comprising:
   a die side and a land side;
   a fold in the semiconductor package substrate, wherein a first portion of the land side and a subsequent portion of the land side are mated;
   a first embedded device disposed within the first portion, wherein the first embedded device exhibits orthogonal electrical coupling through the first portion with at least one via,
   beginning at the semiconductor package substrate die side at the subsequent portion, through the first portion, and terminating at the first embedded device;
   a fold in the semiconductor package substrate, wherein a second portion of the land side and a fourth portion of the land side are mated;
   a second embedded device disposed within the second portion, wherein the second embedded device exhibits orthogonal electrical coupling through the second portion with at least one via, beginning at the semiconductor package substrate die side at the fourth portion, through the second portion, and terminating at the second embedded device; and
   a semiconductive device disposed on the die side, wherein the orthogonal electrical coupling from the first embedded device further orthogonally couples to the semiconductive device, and wherein the orthogonal electrical coupling from the second embedded device further orthogonally couples to the semiconductive device.

2. The semiconductor package substrate of claim 1, further including:
   a virtual recess on the land side, formed at a first end of the semiconductor package substrate that includes the first portion and at a second end of semiconductor package substrate that includes the second portion.

3. The semiconductor package substrate of claim 2, further including a passive device seated in the virtual recess upon the land side.

4. The semiconductor package substrate of claim 1, wherein a first end of the semiconductor package substrate includes the first portion, and wherein the first end of the semiconductor package substrate abuts a portion of the land side.

5. The semiconductor package substrate of claim 4, wherein a second end of the semiconductor package substrate includes the second portion, and wherein the second end abuts a portion of the land side.

6. The semiconductor package substrate of claim 5, further including a passive device seated on the land side between the first end and the second end.

7. The semiconductor package substrate of claim 5, wherein the fold including the first portion is longer than the fold including the second portion.

8. The semiconductor package substrate of claim 5, wherein the fold including the first portion and the fold including the second portion are symmetrical.

9. The semiconductor package substrate of claim 1, further including a board, wherein the semiconductor package substrate first portion is seated on the board by the die side.

10. The semiconductor package substrate of claim 9, wherein the first portion is seated within a recess within the board.

11. The semiconductor package substrate of claim 9, further including:
    wherein the first portion is seated within a first recess within the board; and
    wherein the second portion is seated within a second recess within the board.

12. The semiconductor package substrate of claim 9, wherein the semiconductor package substrate first and second portions are seated on the board by the die side.

* * * * *